(12) United States Patent
Ogasahara et al.

(10) Patent No.: US 6,194,752 B1
(45) Date of Patent: Feb. 27, 2001

(54) DIELECTRIC DEVICE, DIELECTRIC MEMORY AND METHOD OF FABRICATING THE SAME

(75) Inventors: Satoru Ogasahara, Gifu-ken; Mitsuaki Harada, Oogaki; Hiroaki Furukawa, Gifu-ken; Takashi Goto, Oogaki; Tatsuro Gueshi, Hikone; Yoshiyuki Ishizuka, Inazawa, all of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/094,592

(22) Filed: Jun. 15, 1998

(30) Foreign Application Priority Data

Jun. 16, 1997 (JP) .................................................. 9-158809

(51) Int. Cl.⁷ ...................................................... H01L 29/72
(52) U.S. Cl. .......................... 257/295; 257/296; 257/298; 257/300; 257/306; 257/310; 438/200; 438/201; 438/239; 438/240; 438/253; 438/396; 438/48
(58) Field of Search ...................................... 257/295, 296, 257/298, 300, 306, 310; 438/200, 201, 239, 240, 253, 48, 396

(56) References Cited

U.S. PATENT DOCUMENTS 5,652,446 * 7/1997 Sakao ..................................... 257/295
5,731,608 * 3/1998 Hsu et al. ............................. 257/295

FOREIGN PATENT DOCUMENTS

| 0 697 720 | 2/1996 | (EP) . |
| 5-327062 | 12/1993 | (JP) . |
| 8-88334 | 4/1996 | (JP) . |

OTHER PUBLICATIONS

European Patent Office Communication for European Patent Application 98 304 720.0–2203 dated Nov. 3, 1999.
Patent Abstracts of Japan, vol. 096, No. 008, Aug. 30, 1996 * JP 08 088334A (NeC Corp), Apr. 2, 1996.
Patent Abstracts of Japan, vol. 018, No. 144 (e–1521), Mar. 10, 1994 & JP 05 327062 A (Sharp Corp), Dec. 10, 1993.

* cited by examiner

*Primary Examiner*—Edward Wojciechowicz
(74) *Attorney, Agent, or Firm*—Armstrong, Westerman, Hattori, McLeland & Naughton (57) ABSTRACT

A gate insulating layer and a first lower electrode are formed on a channel region of a silicon substrate, and an interlayer insulating film is formed on the silicon substrate so as to cover the first lower electrode and the gate insulating film. A buffer layer is formed on the interlayer insulating film, and a contact hole is formed in the interlayer insulating film and the buffer layer on the first lower electrode. A connecting layer and a second lower electrode are formed in the contact hole. A ferroelectric thin film and an upper electrode are formed in this order on the buffer layer so as to be brought into contact with the upper surface of the second lower electrode.

11 Claims, 7 Drawing Sheets

PRIOR ART

FIG. 8 PRIOR ART

DIELECTRIC DEVICE, DIELECTRIC MEMORY AND METHOD OF FABRICATING THE SAME

BACKGROUND OF THE INVENTION

1. Field of the Invention

The present invention relates generally to a dielectric device having a dielectric film, a dielectric memory using a dielectric film in its gate portion, and a method of fabricating the same.

2. Description of the Related Art

A memory having a capacitor composed of a ferroelectric thin film provided in a gate portion of a field effect transistor (FET) has been known as a nondestructive readable nonvolatile memory. As the structure of such a ferroelectric memory, an MFS (metal-ferroelectrics-semiconductor) structure, an MFIS (metal-ferroelectrics-insulator-semiconductor) structure, an MFMIS (metal-ferroelectrics-metal-insulator-semiconductor) structure, and so forth have been proposed.

In the ferroelectric memory having the MFS structure, a ferroelectric thin film is provided as a gate insulating film of an FET, so that the ferroelectric thin film is brought into direct contact with a semiconductor substrate. Therefore, constituent atoms react with each other and mutually diffuse on the surface of the ferroelectric thin film with the semiconductor substrate. As a result, the characteristics of the ferroelectric memory are degraded, decreasing the reliability thereof.

In the ferroelectric memory having the MFIS structure, an insulating film is provided as a diffusion barrier layer (a buffer layer) for preventing constituent atoms from mutually diffusing between a semiconductor substrate and a ferroelectric thin film. However, the diffusion barrier characteristics of the insulating film are not sufficient, so that the problems of the reaction and the mutual diffusion of the constituent atoms on the surface of the ferroelectric thin film with the semiconductor substrate are not satisfactorily solved.

In the ferroelectric memory having the MFMIS structure, therefore, a capacitor composed of a ferroelectric thin film (hereinafter referred to as a ferroelectric capacitor) is formed on a gate electrode of a normal FET formed on the semiconductor substrate.

Figure 7:
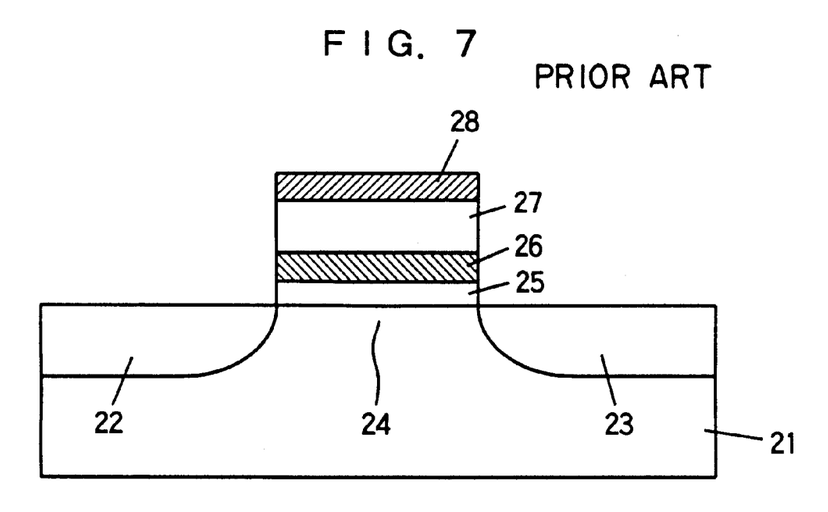
FIG. 7 is a schematic cross-sectional view showing one example of a conventional ferroelectric memory.

FIG. 7 is a schematic cross-sectional view showing one example of the conventional ferroelectric memory having the MFMIS structure.

In FIG. 7, a source region 22 composed of an n$^+$ layer and a drain region 23 composed of an n$^+$ layer are formed with predetermined spacing on the surface of a P-type silicon substrate 21. A region of the silicon substrate 21 between the source region 22 and the drain region 23 is a channel region 24. A gate oxide film 25, a floating gate electrode 26, a ferroelectric thin film 27 and a control gate electrode 28 are formed in this order on the channel region 24.

Description is now made of the principle under which the ferroelectric memory shown in FIG. 7 operates. A sufficient positive voltage to inversely polarize the ferroelectric thin film 27 is applied to the control gate electrode 28, to set the voltage of the control gate electrode 28 to zero again. Therefore, the surface of the ferroelectric thin film 27 with the control gate electrode 28 is negatively charged, and the surface of the ferroelectric thin film 27 with the floating gate electrode 26 is positively charged.

In this case, the surface of the floating gate electrode 26 with the ferroelectric thin film 27 is negatively charged, and the surface of the floating gate electrode 26 with the gate oxide film 25 is positively charged, so that an inversion layer is formed in the channel region 24 between the source region 22 and the drain region 23. As a result, an FET is turned on, although the voltage of the control gate electrode 28 is zero.

Contrary to this, a sufficient negative voltage to inversely polarize the ferroelectric thin film 27 is applied to the control gate electrode 28, to set the voltage of the control gate electrode 28 to zero again. Therefore, the surface of the ferroelectric thin film 27 with the control gate electrode 28 is positively charged, and the surface of the ferroelectric thin film 27 with the floating gate electrode 26 is negatively charged.

In this case, the surface of the floating gate electrode 26 with the ferroelectric thin film 27 is positively charged, and the surface of the floating gate electrode 26 with the gate oxide film 25 is negatively charged. As a result, no inversion layer is formed in the channel region 24 between the source region 22 and the drain region 23, so that the FET is turned off.

If the ferroelectric thin film 27 is thus sufficiently polarized inversely, the FET can be selectively turned on or off even after a voltage applied to the control gate electrode 28 is set to zero. Therefore, it is possible to discriminate between data "1" and "0" which are stored in the ferroelectric memory by detecting a current between a source and a drain.

In the ferroelectric memory shown in FIG. 7, the ferroelectric thin film 27 is formed on the floating gate electrode 26 composed of a material which is low in reactivity, for example, Pt (platinum), and the gate oxide film 25 and the floating gate electrode 26 function as diffusion barrier layers. Consequently, constituent atoms are prevented from reacting with each other and mutually diffusing between the ferroelectric thin film and the semiconductor substrate, as compared with the ferroelectric memory having the MFS structure and the ferroelectric memory having the MFIS structure.

Figure 8:
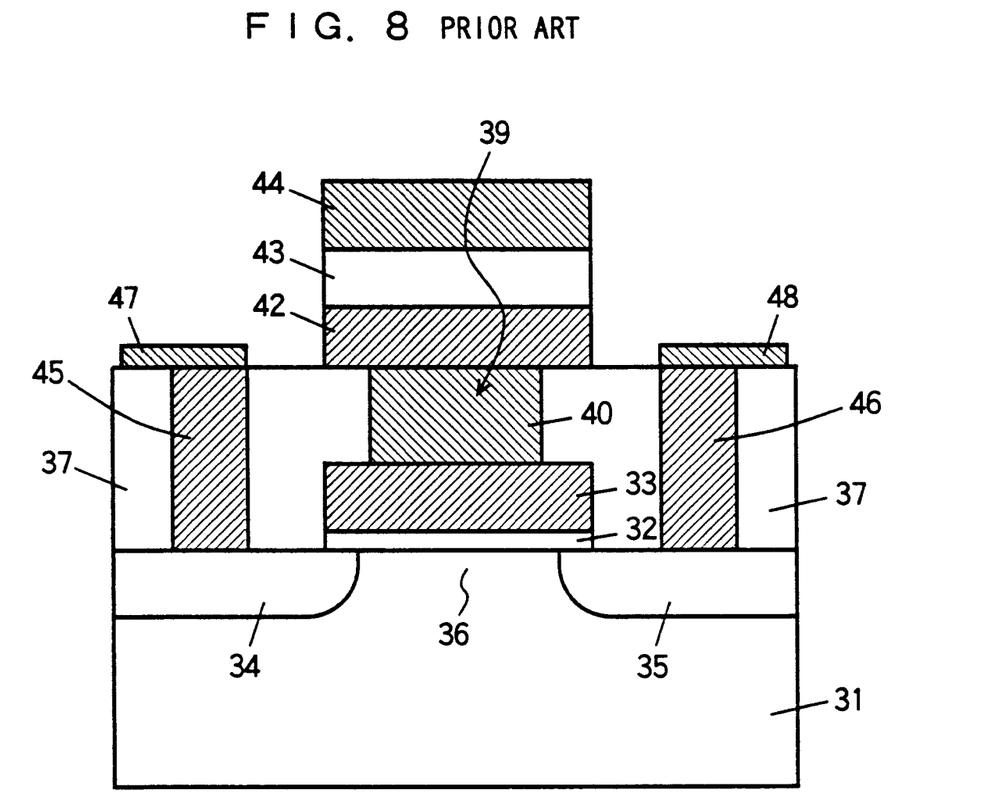
FIG. 8 is a schematic cross-sectional view showing another example of a conventional ferroelectric memory.

FIG. 8 is a schematic cross-sectional view showing another example of the conventional ferroelectric memory having the MFMIS structure. The ferroelectric memory shown in FIG. 8 is disclosed in JP-A-5-327062.

In FIG. 8, a source region 34 composed of a p$^+$ layer and a drain region 35 composed of a p$^+$ layer are formed with predetermined spacing on the surface of an n$^+$ silicon substrate 31. A region of the silicon substrate 31 between the source region 34 and the drain region 35 is a channel region 36. A gate oxide film 32 is formed on the channel region 36, and a first lower electrode 33 is formed on the gate oxide film 32.

An interlayer insulating film 37 is formed on the silicon substrate 31 and the first lower electrode 33. A contact hole 39 is formed in the interlayer insulating film 37 on the first lower electrode 33, and a wiring layer 40 is formed in the contact hole 39.

Contact holes are respectively provided in the interlayer insulating film 37 on the source region 34 and the interlayer insulating film 37 on the drain region 35, and wiring layers 45 and 46 are respectively formed in the contact holes.

Furthermore, a second lower electrode 42 is formed on the wiring layer 40 connected to the first lower electrode 33. A ferroelectric thin film 43 is formed on the second lower electrode 42, and an upper electrode 44 is formed on the ferroelectric thin film 43. Further, ohmic electrodes 47 and 48 are respectively formed on the wiring layers 45 and 46 which are connected to the source region 34 and the drain region 35.

In the dielectric memory shown in FIG. 8, the ferroelectric thin film 43 is formed on the second lower electrode 42 composed of a material which is low in reactivity, for example, Pt, and the interlayer insulating film 37 is provided between the first lower electrode 33 and the second lower electrode 42, so that constituent atoms are further prevented from reacting with each other and mutually diffusing between the ferroelectric thin film 43 and the silicon substrate 31.

In the fabrication of the ferroelectric memory shown in FIG. 8, in patterning the upper electrode 44, the ferroelectric thin film 43 and the second lower electrode 42 by etching, a conductive material such as Pt which is a material for the upper electrode 44 and the second lower electrode 42 which have been etched may, in some cases, adhere or deposit on sidewalls of the ferroelectric thin film 43. Therefore, a current leaks between the upper electrode 44 and the second lower electrode 42, so that the reliability of the ferroelectric memory is decreased, and the fabrication yield thereof is decreased.

SUMMARY OF THE INVENTION

An object of the present invention is to provide a dielectric device whose reliability and yield are prevented from being decreased by the adhesion or the deposition of a conductive material on sidewalls of a dielectric film.

Another object of the present invention is to provide a dielectric memory whose reliability and yield are prevented from being decreased by the adhesion or the deposition of a conductive material on sidewalls of a dielectric film.

Still another object of the present invention is to provide a method of fabricating a dielectric device whose reliability and yield are prevented from being decreased by the adhesion or the deposition of a conductive material on sidewalls of a dielectric film.

A further object of the present invention is to provide method of fabricating a dielectric memory whose reliability and yield are prevented from being decreased by the adhesion or the deposition of a conductive material on sidewalls of the dielectric film.

A dielectric device according to the present invention comprises a first conductive layer, an insulating layer formed so as to cover the first conductive layer and having a contact hole, a second conductive layer provided in the contact hole of the insulating layer, and a dielectric film formed on the second conductive layer.

In the dielectric device, the second conductive layer which is brought into contact with the dielectric film is provided in the contact hole of the insulating layer. In patterning the dielectric film, therefore, a material for the second conductive layer does not adhere or deposit on sidewalls of the dielectric film. Consequently, the reliability and the yield are prevented from being decreased by the adhesion or the deposition of a conductive material on the sidewalls of the dielectric film.

The dielectric film may be a ferroelectric film. In this case, the reliability and the yield of the dielectric device including the ferroelectric film are improved.

The dielectric device may further comprise a third conductive layer formed on the dielectric film. In this case, dielectric capacitor is constructed. Also in this case, since the second conductive layer which is contact with the dielectric film is provided in the contact hole of the insulating layer, reduction of the area of the capacitor is realized.

The dielectric device may further comprise a connecting layer formed under the second conductive layer in the contact hole for electrically connecting the second conductive layer to the first conductive layer.

In this case, the connecting layer and the second electrode layer are provided in the contact hole of the insulating layer, and the second conductive layer in the contact hole is electrically connected to the first conductive layer by the connecting layer.

A dielectric memory provided in a semiconductor according to another aspect of the present invention comprises first and second impurity regions formed with predetermined spacing in the semiconductor, a gate insulating film formed on a region between the first and second impurity regions, a first lower electrode layer formed on the gate insulating film, an interlayer insulating film formed on the semiconductor so as to cover the first lower electrode layer and the gate insulating film and having a contact hole, a second lower electrode layer formed in the contact hole of the interlayer insulating film and electrically connected to the first lower electrode layer, a dielectric film formed on the interlayer insulating film so as to be brought into contact with the upper surface of the second lower electrode layer, and an upper electrode layer formed on the dielectric film.

In the dielectric memory, the second lower electrode layer which is brought into contact with the lower surface of the dielectric film is provided in the contact hole of the interlayer insulating film. In patterning the upper electrode layer and the dielectric film, therefore, a material for the second lower electrode layer does not adhere or deposit on sidewalls of the dielectric film. Even when a material for the upper electrode layer adheres or deposits on the sidewalls of the dielectric film, a current does not leak between the upper electrode layer and the second lower electrode layer because the second lower electrode layer is provided in the contact hole of the interlayer insulating film. Consequently, the reliability and the yield are prevented from being decreased by the adhesion or the deposition of a conductive material on the sidewalls of the dielectric film.

The dielectric memory may further comprise a connecting layer formed under the second lower electrode layer in the contact hole for electrically connecting the second lower electrode layer to the first lower electrode layer.

In this case, the connecting layer and the second lower electrode layer are provided in the contact hole of the interlayer insulating film, and the second lower electrode layer in the contact hole is electrically connected to the first lower electrode layer by the connecting layer.

The dielectric memory may further comprise a buffer layer formed on the interlayer insulating film. In this case, the dielectric film is formed on the interlayer insulating film through the buffer layer, so that the stress applied to the dielectric film formed on the interlayer insulating film is retrieved. Therefore, the dielectric film is prevented from being cracked, and constituent elements are prevented from reacting with each other and mutually diffusing between the dielectric film and the interlayer insulating film.

The dielectric film may be a ferroelectric film. In this case, the reliability and the yield of the dielectric memory including the ferroelectric film are improved. The ferroelectric film may have a perovskite crystal structure.

The semiconductor may be a semiconductor substrate, or a semiconductor layer. The semiconductor may be silicon of a first conductivity type, and the first and second impurity regions may be formed of silicon of a second conductivity type opposite to the first conductivity type.

A dielectric device according to still another aspect of the present invention comprises an insulating layer having a contact hole, a conductive layer provided in the contact hole of the insulating layer, and a dielectric film formed on the conductive layer.

In the dielectric device, the conductive layer which is brought into contact with the dielectric film is provided in the contact hole of the insulating layer, so that a material for the conductive layer does not adhere or deposit on sidewalls of the dielectric film at the time of patterning the dielectric film. Consequently, the reliability and the yield are prevented from being decreased by the adhesion or the deposition of a conductive material on the sidewalls of the dielectric film.

The dielectric device may further comprise another conductive layer formed on the dielectric film. In this case, a dielectric capacitor is constructed.

A method of fabricating a dielectric device according to still another aspect of the present invention comprises the steps of forming a first conductive layer, forming an insulating layer on the first conductive layer, forming a contact hole in the insulating layer, forming a second conductive layer in the contact hole of the insulating layer, forming a dielectric film on the second conductive layer, and patterning the dielectric film.

In the fabricating method, the second conductive layer is formed in the contact hole of the insulating layer. In forming the dielectric film on the second conductive layer and patterning the dielectric film, therefore, a material for the second conductive layer does not adhere or deposit on sidewalls of the dielectric film. Consequently, the reliability and the yield of the dielectric device are improved.

The dielectric film may be a ferroelectric film. In this case, the reliability and the yield of the dielectric device including the ferroelectric film are improved.

The fabricating method may further comprise the steps of forming a third conductive layer on the dielectric film, and patterning the third conductive layer. In this case, a dielectric capacitor is constructed.

A method of fabricating a dielectric memory according to a further aspect of the present invention comprises the steps of forming a gate insulating layer on a channel region, forming a first lower electrode layer on the gate insulating film, forming an interlayer insulating film so as to cover the first lower electrode layer and the gate insulating film, forming a contact hole in the interlayer insulating film, forming a second lower electrode layer electrically connected to the first lower electrode layer in the contact hole of the interlayer insulating film, forming a dielectric film on the interlayer insulating film so as to be brought onto contact with the upper surface of the second lower electrode layer, forming an upper electrode layer on the dielectric films and patterning the upper electrode layer and the dielectric film.

In the fabricating method, the second lower electrode layer is formed in the contact hole of the interlayer insulating film. In forming the dielectric film and the upper electrode layer in this order on the second lower electrode layer and patterning the upper electrode layer and the dielectric film, therefore, a material for the second lower electrode layer does not adhere or deposit on sidewalls of the dielectric film. Even if a material for the upper electrode layer adheres or deposits on the sidewalls of the dielectric film, a current does not leak between the upper electrode layer and the second lower electrode layer because the second lower electrode layer is provided in the contact hole of the interlayer insulating film. Consequently, the reliability and the yield of the dielectric memory are improved.

In the fabricating method, the step of forming the second lower electrode layer may comprise the steps of forming a connecting layer up to a predetermined depth in the contact hole, and forming an electrode layer on the connecting layer in the contact hole.

In this case, the connecting layer and the second lower electrode layer are provided in the contact hole, and the second lower electrode layer is electrically connected to the first lower electrode layer by the connecting layer.

The fabricating method may further comprise the step of forming a diffusion barrier layer on the connecting layer. Therefore, the oxidation of the connecting layer and the diffusion of impurities into the first lower electrode layer are prevented.

The fabricating method may further comprise the step of forming a buffer layer on the interlayer insulating film.

In this case, the dielectric film is formed on the interlayer insulating film through the buffer layer, so that the stress applied to the dielectric film is retrieved. Therefore, the dielectric film is prevented from being cracked, and constituent elements are prevented from reacting with each other and mutually diffusing between the dielectric film and the interlayer insulating film.

The dielectric film may be a ferroelectric film. In this case, the reliability and the yield of the dielectric memory including the ferroelectric film are improved. The ferroelectric film may have a perovskite crystal structure.

The fabricating method may further comprise the step of forming first and second impurity regions on both side of a channel region. The channel region may be formed of silicon of a first conductivity type, and the first and second impurity regions may be formed of silicon of a second conductivity type opposite to the first conductivity type.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
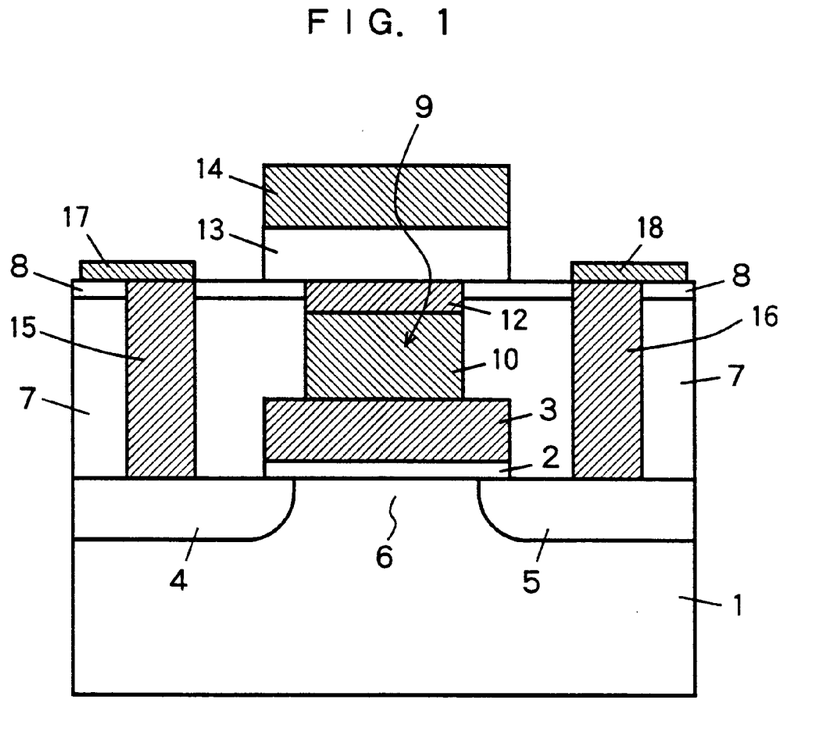
FIG. 1 is a schematic cross-sectional view showing the construction of a ferroelectric memory according to one embodiment of the present invention.

FIG. 1 is a schematic cross-sectional view showing the construction of a ferroelectric memory according to one embodiment of the present invention.

In FIG. 1, a source region 4 composed of an n+ layer and a drain region 5 composed of an n+ layer are formed with predetermined spacing in the surface of a p-type single crystalline silicon substrate 1. A region of the silicon substrate 1 between the source region 4 and the drain region is a channel region 6.

A gate insulating film 2 composed of $SiO_2$ is formed on the channel region 6. A first lower electrode (a gate electrode) 3 composed of polysilicon is formed on the gate insulating film 2. An interlayer insulating film 7 is formed on the silicon substrate 1 so as to cover the first lower electrode 3 and the gate insulating film 2. A buffer layer 8 composed of $TiO_2$ (titanium oxide), $CeO_2$ (cerium oxide), etc. is formed on the interlayer insulating film 7.

A contact hole 9 is formed in the interlayer insulating film 7 and the buffer layer 8 on the first lower electrode 3. A connecting layer (a plug) 10 composed of a conductive material such as polysilicon or W (tungsten) is formed up to a predetermined depth in the contact hole 9. A second lower electrode 12 composed of a conductive material such as Pt (platinum) or $IrO_2$ (iridium oxide) is formed on the connecting layer 10 in the contact hole 9.

A ferroelectric thin film 13 composed of PZT (lead titanate zirconate) or SrBiTaO having a perovskite crystal structure is formed on the buffer layer 8 so as to be brought into contact with the upper surface of a second lower electrode 12. An upper electrode 14 composed of a conductive material such as Pt or $IrO_2$ is formed on the ferroelectric thin film 13.

Contact holes are respectively formed in the buffer layer 8 and the interlayer insulating film 7 on the source region 4 and the buffer layer 8 and the interlayer insulating film 7 on the drain region 5, and a source electrode 15 and a drain electrode 16 which are composed of a conductive material such as polysilicon are respectively formed in the contact holes. Wiring layers 17 and 18 are respectively formed on the source electrode 15 and the drain electrode 16.

In the present embodiment, the source region 4 and the drain region 5 respectively correspond to first and second impurity regions, and the first lower electrode 3 corresponds to a first conductive layer or a first lower electrode layer. The second lower electrode 12 corresponds to a second lower electrode layer, the connecting layer 10 corresponds to a connecting layer, and the connecting layer 10 and the second lower electrode 12 constitute a second conductive layer. Further, the upper electrode 14 corresponds to an upper electrode layer.

FIGS. 2, 3, 4 and 5 are cross-sectional views showing the steps of a method of fabricating the ferroelectric memory shown in FIG. 1.

Figure 2:
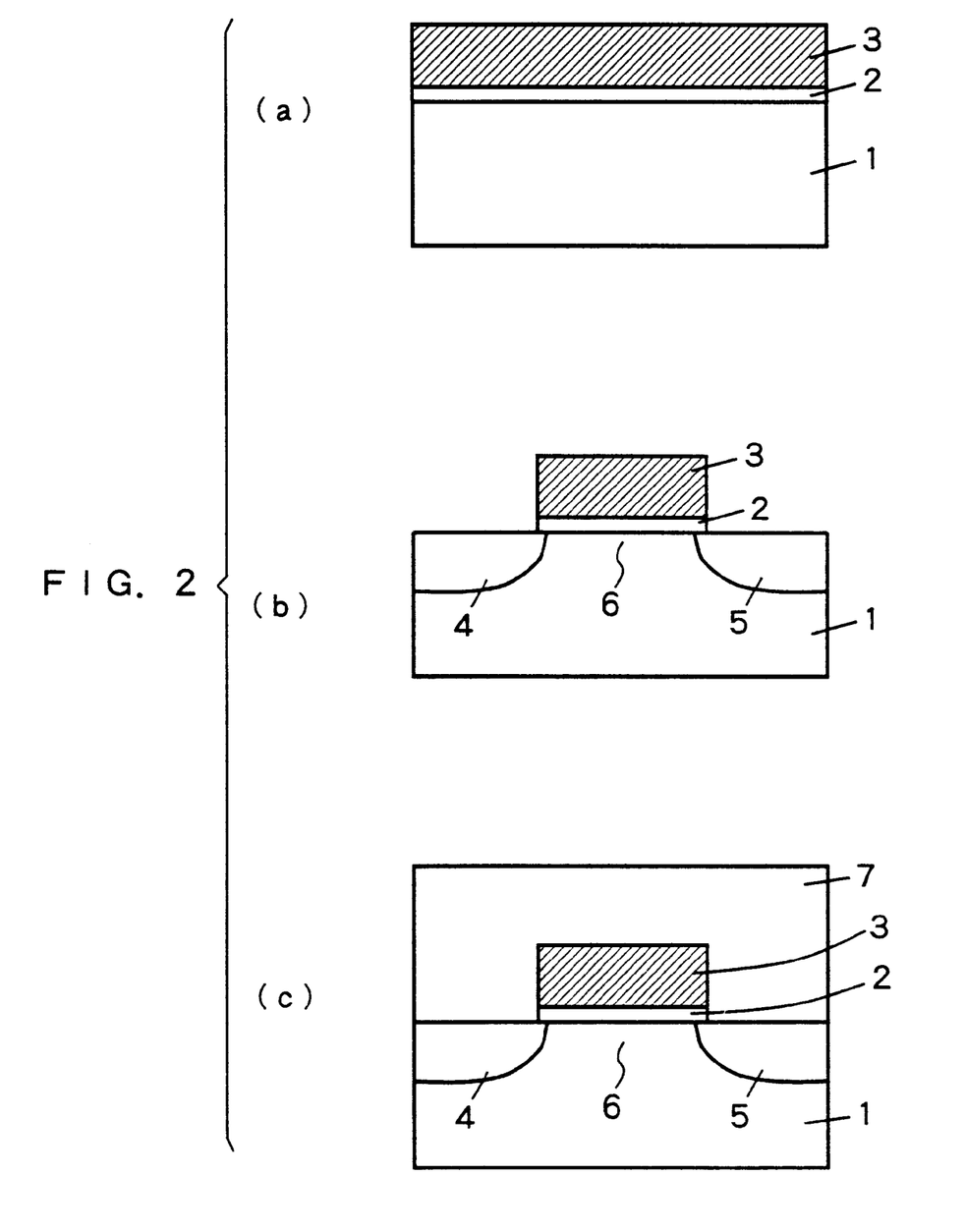
FIG. 2 is a cross-sectional view showing the steps of a method of fabricating the ferroelectric memory shown in FIG. 1.

First, as shown in FIG. 2(a), a gate insulating film 2 composed of $SiO_2$ having a thickness of 100 Å is formed on a p-type silicon substrate 1 by a thermal oxidation method, and a first lower electrode 3 composed of polysilicon having a thickness of 2000 Å is formed on the gate insulating film 2 by a CVD method (a chemical vapor deposition method).

As shown in FIG. 2(b), the first lower electrode 3 and the gate insulating film 2 in a portion excluding a gate forming region on the silicon substrate 1 are then removed using a dry process such as reactive-ion etching (RIE) or ion milling, to form a gate portion. n-type impurities (an n-type dopant) are ion-implanted into the surface of the silicon substrate 1 using the first lower electrode 3 as a mask for ion implantation, to perform heat treatment. Consequently, a source region 4 and a drain region 5 which are composed of an n-type impurity layer (an n+ layer) are respectively formed in self-alignment with the gate insulating film 2 and the first lower electrode 3 on the silicon substrate 1. A region of the silicon substrate 1 between the source region 4 and the drain region 5 is a channel region 6.

Thereafter, an interlayer insulating film 7 composed of $SiO_2$, etc. having a thickness of approximately 6000 Å is formed by a CVD method or the like on the silicon substrate 1 so as to cover the first lower electrode 3 and the gate insulating film 2, as shown in FIG. 2(c).

Figure 3:
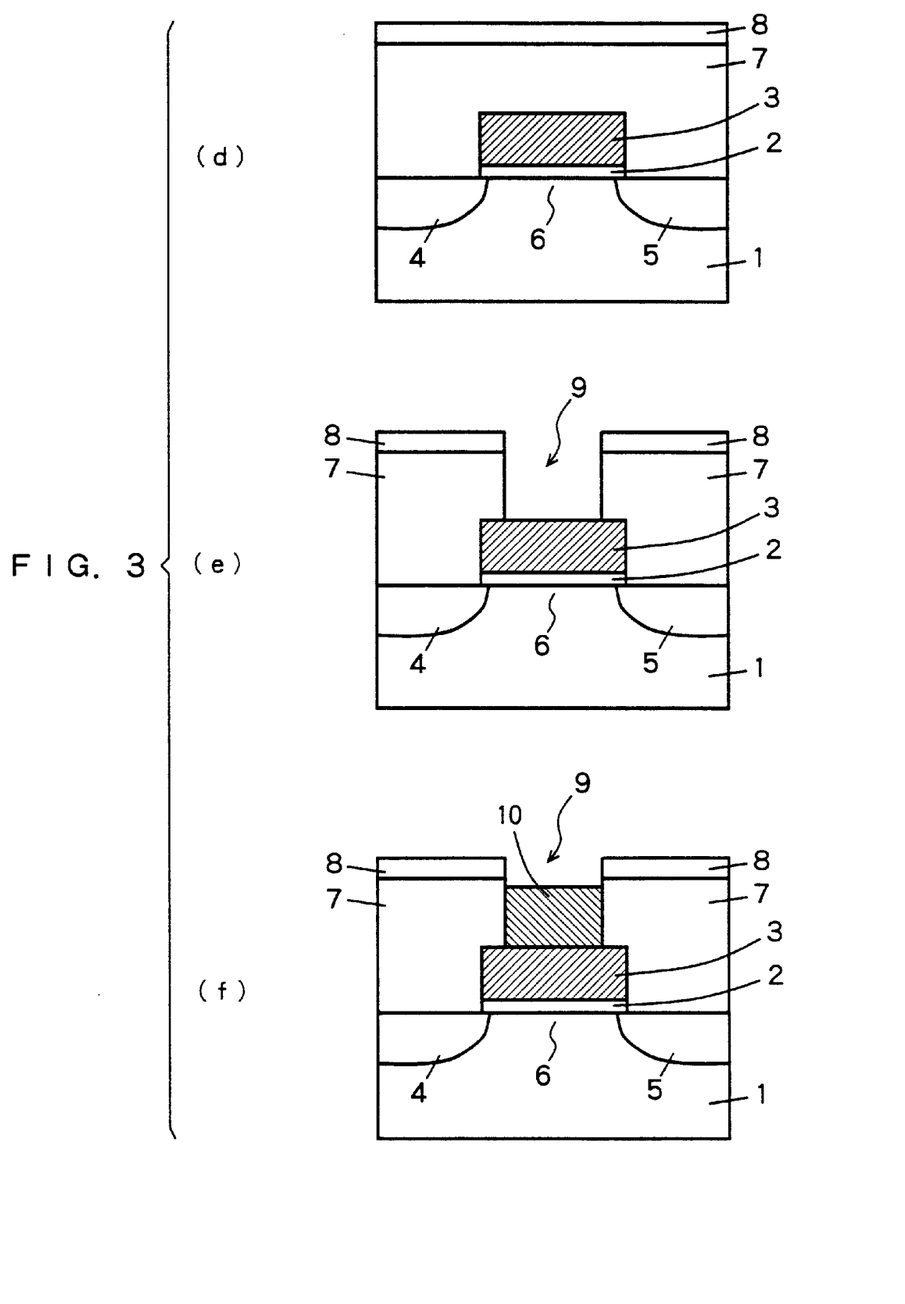
FIG. 3 is a cross-sectional view showing the steps of a method of fabricating the ferroelectric memory shown in FIG. 1.

As shown in FIG. 3(d), a buffer layer 8 having a thickness of 500 Å composed of $TiO_2$, $CeO_2$, etc. is then formed on the interlayer insulating film 7. Thereafter, a contact hole 9 is provided by a lithographic technique in the buffer layer 8 and the interlayer insulating film 7 on the first lower electrode 3, as shown in FIG. 3(e).

As shown in FIG. 3(f), a connecting layer 10 composed of a conductive material such as polysilicon or W is formed in the contact hole 9. In this case, the thickness of the connecting layer 10 is set such that the distance from an upper end of the contact hole 9 to the upper surface of the connecting layer 10 is 1500 Å. As a method of forming the connecting layer 10, a conductive layer is formed on the inside of the contact hole 9 and the whole surface of the buffer layer 8, after which the whole surface is etched, to remove a conductive layer on the buffer layer 8.

Figure 4:
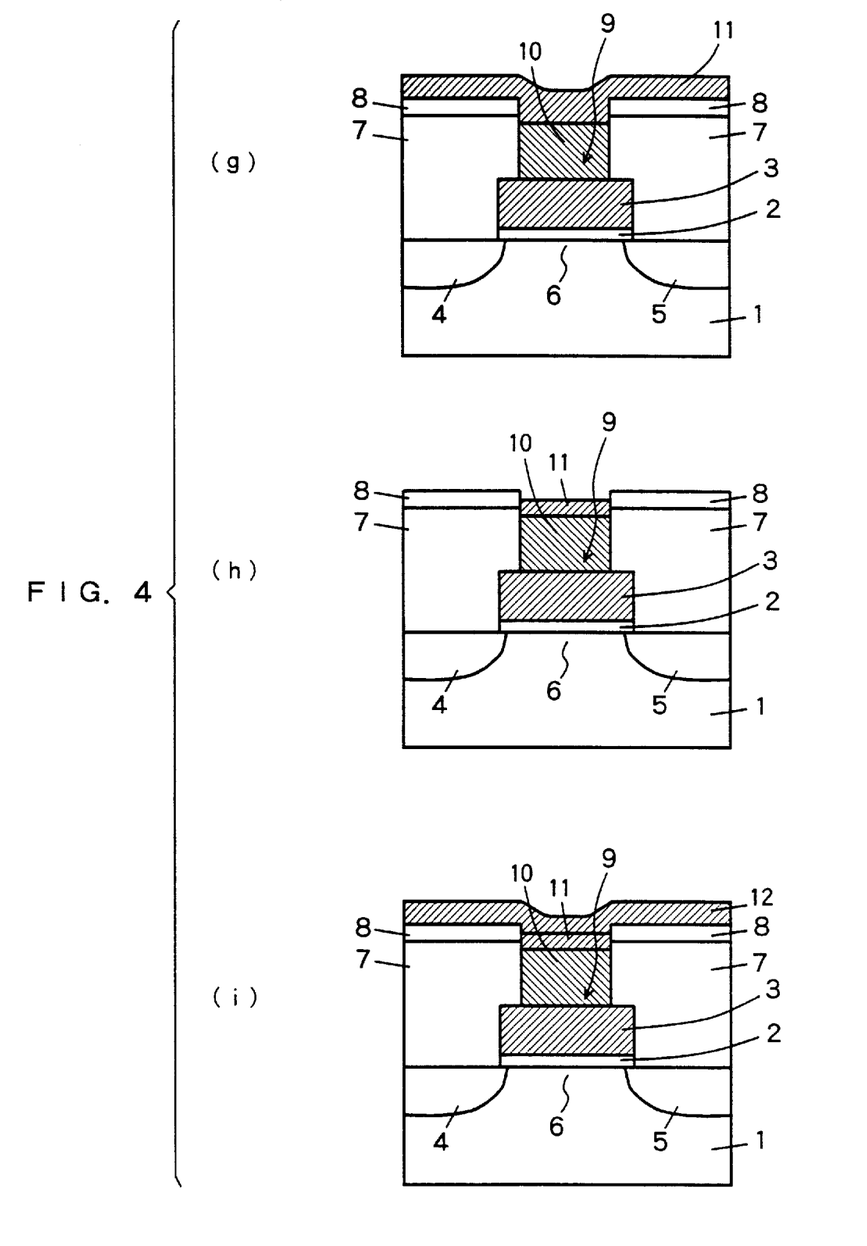
FIG. 4 is a cross-sectional view showing the steps of a method of fabricating the ferroelectric memory shown in FIG. 1.

As shown in FIG. 4(g), a diffusion barrier layer 11 composed of a conductive material such as TiN or TaSiN is then formed on the inside of the contact hole 9 and the whole surface of the buffer layser 8 by a sputtering method, a CVD method or the like in order to prevent the connecting layer 10 from being oxidized and prevent impurities from being diffused into a gate portion.

As shown in FIG. 4(h), the entire surface of the diffusion barrier layer 11 is etched, to remove the diffusion barrier layer 11 on the buffer layer 8 as well as to etch the buffer layer 11 back until the upper surface of the diffusion barrier layer 11 in the contact hole 9 is lower than the upper surface of the buffer layer 8. In this case, mixed gas of $BCl_3$ and $Cl_2$ is used as etching gas, and the etching conditions are an RF power of 250 W and a pressure of $2 \times 10^{-2}$ torr. The other gas such as Ar or $N_2$ may be mixed with the mixed gas. A diffusion barrier layer 11 having a thickness of 300 Å is thus formed on the connecting layer 10 in the contact hole 9. The diffusion barrier layer 11 will be a part of the second lower electrode 12 formed in the subsequent process.

As shown in FIG. 4(i), a second lower electrode 12 having a thickness of 3000 Å composed of a conductive material such as Pt or $IrO_2$ is then formed on the buffer layer 8 and the diffusion barrier layer 11 in the contact hole 9 by a sputtering method, a CVD method, a sol-gel method or the like. Another material on which a ferroelectric crystal can be grown may be used as a material for the second lower electrode 12. For example, $RuO_x$ (ruthenium oxide) may be used.

Figure 5:
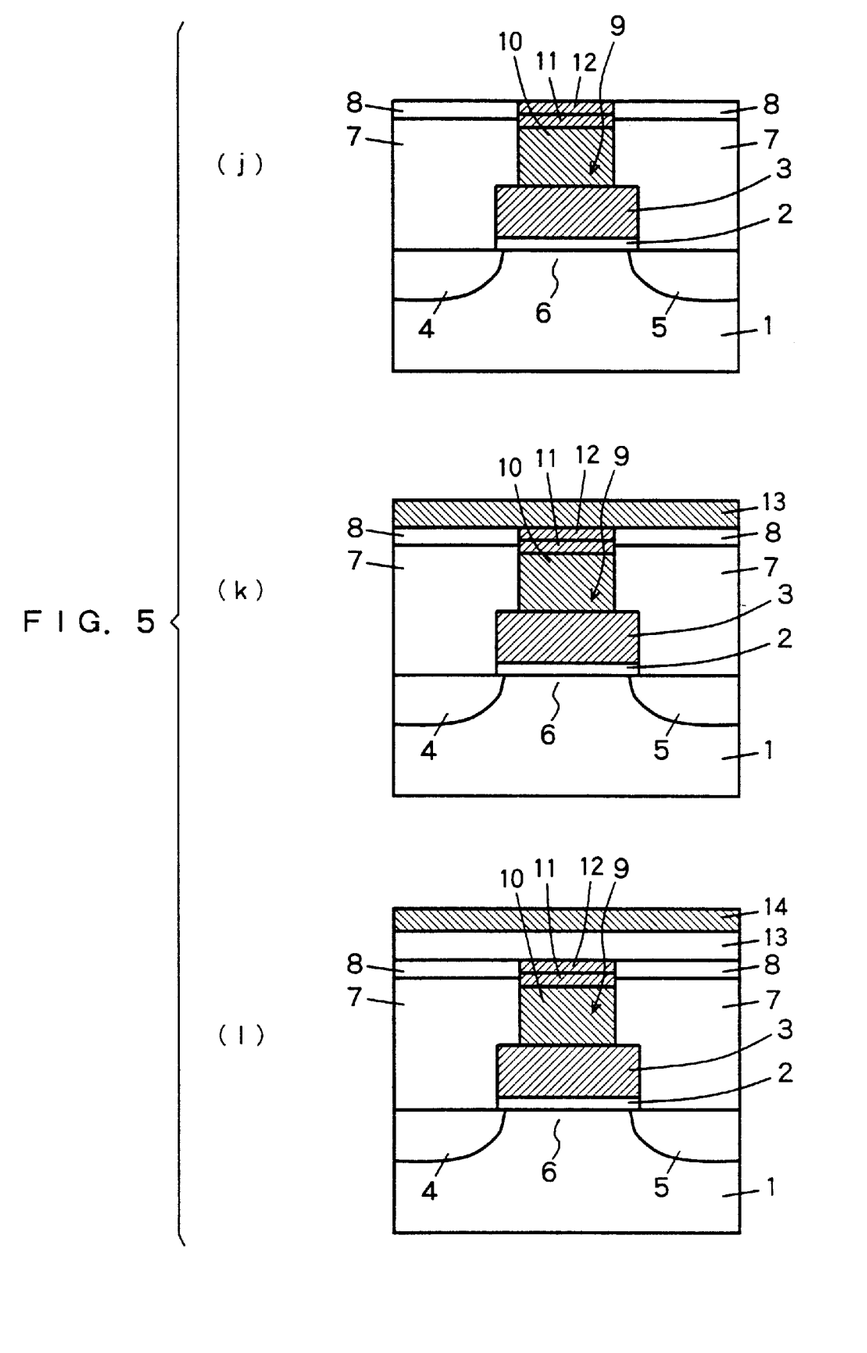
FIG. 5 is a cross-sectional view showing the steps of a method of fabricating the ferroelectric memory shown in FIG. 1.

As shown in FIG. 5(j), the second lower electrode 12 is then flattened by etch-back, a CMP method (a chemical mechanical polishing method) or the like, leaving the second lower electrode 12 in the contact hole 9, to form the second lower electrode 12 having a thickness of 1200 Å in the contact hole 9. In this case, $Cl_2$ is used as etching gas, and the etching conditions are an RF power of 300 W and a pressure of $3 \times 10^{-3}$ torr. As the etching gas, the other gas such as Ar, HBr or $BCl_3$ may be used, or their mixed gas may be used.

The second lower electrode 12 and the diffusion barrier layer 11 may be simultaneously flattened by etch-back or a CMP method after continuously forming the diffusion barrier layer 11 and the second lower electrode 12 instead of etching the diffusion barrier layer 11 back in the step shown in FIG. 4(f).

As shown in FIG. 5(k), a ferroelectric thin film 13 having a thickness of 2000 Å composed of PZT, SrBiTaO, etc. is then formed by a sol-gel method, a sputtering method, a CVD method or the like on the second lower electrode 12 and the buffer layer 8.

As shown in FIG. 5(l), an upper electrode 14 composed of a conductive material such as Pt or $IrO_2$ having a thickness of 1500 Å is then formed by a sputtering method on the ferroelectric thin film 13.

Figure 6:
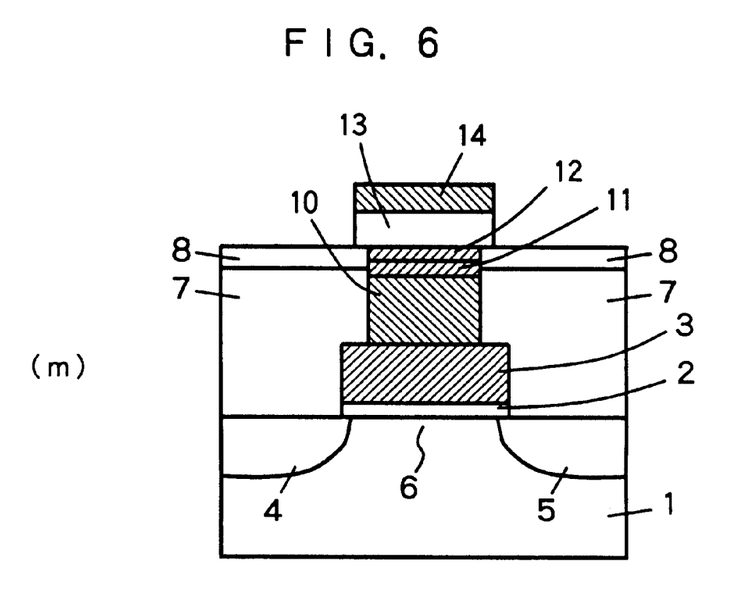
FIG. 6 is a cross-sectional view showing the steps of a method of fabricating the ferroelectric memory shown in FIG. 1.

Thereafter, the upper electrode 14 and the ferroelectric thin film 13 are simultaneously patterned by etching, as shown in FIG. 6(m). In this case, $Cl_2$ is used as etching gas, and the etching conditions are an RF power of 300 W and a pressure of $3 \times 10^{-3}$ torr. As the etching gas, the other gas such as Ar, $CF_4$, $SF_6$, HBr, or $BCl_3$ may be used, or their mixed gas may be used. The upper electrode 14 and the ferroelectric thin film 13 may be separately etched. At the time of etching, the whole of the buffer layer 8 may be etched. The ferroelectric thin film 13 need not necessarily extend over the buffer layer 8, provided that it is brought into contact with the upper surface of the second lower electrode 12.

The buffer layer 8 and the interlayer insulating film 7 on the source electrode 4 and the buffer layer 8 and the interlayer insulating film 7 on the drain electrode 5 are then respectively provided with the contact holes, and a source electrode 15 and a drain electrode 16 composed of a conductive material such as polysilicon or tungsten are respectively formed in the contact holes, as shown in FIG. 1. Finally, wiring layers 17 and 18 composed of Al are respectively formed on the source electrode 15 and the drain electrode 16. A ferroelectric memory according to the present embodiment is thus fabricated.

In the ferroelectric memory according to the present embodiment, the second lower electrode 12 is provided in the contact hole 9 of the interlayer insulating film 7. In patterning the upper electrode 14 and the ferroelectric thin film 13 by etching, therefore, the conductive material for the second lower electrode 12 does not adhere or deposit on sidewalls of the ferroelectric thin film 13. Even if the conductive material for the upper electrode 14 adheres or deposits on the sidewalls of the ferroelectric thin film 13, a current does not leak between the upper electrode 14 and the second lower electrode 12 because the second lower electrode 12 is provided in the contact hole 9 of the interlayer insulating film 7. As a result, the reliability and the yield of the ferroelectric memory are improved.

In the step shown in FIG. 5(k), the ferroelectric thin film 13 is formed on the interlayer insulating film 7 through the buffer layer 8, so that the stress applied to the ferroelectric thin film 13 is retrieved by the buffer layer 8. Therefore, the ferroelectric thin film 13 is prevented from being cracked, and constituent elements are prevented from reacting with each other (for example, reaction between Pb and $SiO_2$) and mutually diffusing between the ferroelectric thin film 13 and the interlayer insulating film 7. As a result, the reliability and the yield of the ferroelectric memory are further improved.

Furthermore, the ferroelectric thin film 13 is formed on the second upper electrode 12 composed of a material which is low in reactivity, for example, Pt, and the interlayer insulating film 7 is provided between the ferroelectric thin film 13 and the silicon substrate 1, so that the constituent elements are sufficiently prevented from reacting with each other or mutually diffusing between the ferroelectric thin film 13 and the silicon substrate 1.

Description is now made of operations performed by the ferroelectric memory shown in FIG. 1. A sufficient positive voltage to inversely polarize the ferroelectric thin film 13 is applied to the upper electrode 14, to set the voltage of the upper electrode 14 to zero again. Consequently, the surface of the ferroelectric thin film 13 with the upper electrode 14 is negatively charged, and the surface of the ferroelectric thin film 13 with the second lower electrode 12 is positively charged.

In this case, the surface of the second lower electrode 12 with the ferroelectric thin film 13 is negatively charged, and the surface of the first lower electrode 3 with the gate insulating film 2 is positively charged. As a result, an inversion layer is formed in the channel region 6 between the source region 4 and the drain region 5, so that an FET is turned on, although the voltage of the upper electrode 14 is zero.

Contrary to this, a sufficient negative voltage to inversely polarize the ferroelectric thin film 13 is applied to the upper electrode 14, to set the voltage of the upper electrode 14 to zero again. Consequently, the surface of the ferroelectric thin film 13 with the upper electrode 14 is positively charged, and the surface of the ferroelectric thin film 13 with the second lower electrode 12 is negatively charged.

In this case, the surface of the second lower electrode 12 with the ferroelectric thin film 13 is positively charged, and the surface of the first lower electrode 3 with the gate insulating film 2 is negatively charged. As a result, no inversion layer is formed in the channel region 6 between the source region 4 and the drain region 5, so that the FET is turned off.

When the ferroelectric thin film 13 is thus sufficiently polarized inversely, the FET can be selectively turned on or off even after a voltage applied to the upper electrode 14 is set to zero. Therefore, it is possible to discriminate between data "1" and "0" which are stored in the ferroelectric memory by detecting a current between a source and a drain.

A voltage other than "0", by which the FET can be selectively turn on or off, may be applied to the upper electrode 14.

As the ferroelectric thin film 13, ferroelectrics composed of the following materials may be used.

(1) Bismuth system layer structure ferroelectrics expressed by the following general formula may be used:

$$(Bi_2O_2)^{2+}(A_{n-1}B_nO_{3n+1})^{2-}$$

A is Sr, Ca or Ba, and B is Ti, Ta, Nb, W or V.
When n=1:

$$Bi_2WO_6$$

$$Bi_2VO_{5.5}$$

When n=2

$$Bi_2O_3/SrTa_2O_6$$

$$(SrBi_2Ta_2O_9):SBT$$

$Bi_2O_3/SrNb_2O_6$ $(SrBi_2Nb_2O_9)$

When n=3

$Bi_2O_3/SrTa_2O_6/BaTiO_3$ $Bi_2O_3/SrTaO_6/SrTiO_3$ $Bi_2O_3/Bi_2Ti_3O_9$ $(Bi_4Ti_3)_{12}):BIT$

When n=4

$Bi_2O_3/Sr_3Ti_4O_{12}$ $(Sr_3Bi_2Ti_4O_{15})$ $Bi_2O_3/Bi_2Ti_3O_9/SrTiO_3$ $(SrBi_4Ti_4O_{15})$ (2) Ferroelectrics (of an isotropic material system) expressed by the following general formula may be used:

$Pb(Zr_XTi_{1-X})O_3:PZT(PbZr_{0.5}Ti_{0.5})O_3$ $(Pb_{1-Y}La_Y)(Zr_XTi_{1-X})O_3:PLZT$ $(Sr_{1-X}Ca_X)TiO_3$ $(Sr_{1-X}Ba_X)TiO_3:(Sr_{0.4}Ba_{0.6})TiO_3$ $(Sr_{1-X-Y}Ba_XM_Y)Ti_{1-Z}N_ZO_3$

M is La, Bi or Sb, and N is Nb, V, Ta, Mo or W.

As a method of forming the ferroelectric thin film 13, a molecular beam epitaxy (MBE) method, a laser ablation method, a laser molecular beam epitaxy method, a sputtering method (of an RF (Radio Frequency) type, a DC (Direct Current) type, or an ion beam type), a reactive evaporation method, an MOCVD method (a metal organic chemical vapor deposition method), a mist deposition method, a sol-gel method, etc. can be used depending on the above-mentioned material for the ferroelectric thin film 13.

A material for the second lower electrode 12 and the upper electrode 14 are not limited to Pt or $IrO_2$. The other material may be used. Examples include noble metals (Au, Ag, Pt, Ru, Rh, Pb, Os, Ir, etc.), high-melting point metals (Co, W, Ti, etc.), high-melting point metal compounds (TiN, IrSiN, etc.), conductive oxides ($RuO_2$, $RhO_2$, $OSO_2$, $IrO_2$, $ReO_2$, $ReO_3$, $MoO_2$, $WO_2$, $SrRuO_3$, $Pb_2RuO_{3-X}$, $Bi_2Ru_2O_{7-X}$, etc.), or alloys of the materials.

The second lower electrode 12 and the upper electrode 14 may have a multilayer structure of the above-mentioned materials, or a two-layer structure in which a Pt layer is formed on a Ti layer, for example.

Materials for the first lower electrode 3 and the connecting layer 10 are not limited to polysilicon or W. Other conductive materials may be used.

Furthermore, although in the above-mentioned embodiment, the FET is formed on the silicon substrate 1, the FET may be formed on the other semiconductor substrate or semiconductor layer.

Although description was made of the ferroelectric memory having an n-type channel, a ferroelectric memory having a p-type channel is also realized by reversing the conductivity type of each layer.

Although in the above-mentioned embodiment, one contact hole 9 is provided in the interlayer insulating film 7 on the first lower electrode 3, a plurality of contact holes may be formed in the interlayer insulating film 7 on the first lower electrode 3 so that second lower electrodes in the contact holes are brought into contact with the ferroelectric thin film 13.

Furthermore, one ferroelectric thin film may be shared by a plurality of FETs so that the ferroelectric thin film is brought into contact with second lower electrodes in a plurality of contact holes provided in upper parts of the plurality of FETs.

Although in the above-mentioned embodiment, description was made of a case where the present invention is applied to the ferroelectric memory which operates as a nonvolatile memory, the present invention is also applicable to a ferroelectric memory which performs nonvolatile operations. Further, the present invention is also applicable to another dielectric device such as a capacitor having a structure in which a conductive layer is brought into contact with a dielectric film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dielectric memory comprising:

first and second impurity regions formed with predetermined spacing in a semiconductor;

a gate insulating film formed on a region between said first and second impurity regions;

a first lower electrode layer formed on said gate insulating film;

an interlayer insulating film formed on said semiconductor so as to cover said first lower electrode layer and said gate insulating film and having a contact hole;

a second lower electrode layer formed in said contact hole of said interlayer insulating film and electrically connected to said first lower electrode layer;

a dielectric film formed on said interlayer insulating film so as to be brought into contact with the upper surface of said second lower electrode layer; and an upper electrode layer formed on said dielectric film.

2. The dielectric memory according to claim 1, further comprising a connecting layer formed under said second lower electrode layer in said contact hole for electrically connecting said second lower electrode layer to said first lower electrode layer.

3. The dielectric memory according to claim 1, further comprising a buffer layer formed on said interlayer insulating film.

4. The dielectric memory according to claim 1, wherein said dielectric film is a ferroelectric film.

5. The dielectric memory according to claim 4, wherein said ferroelectric film has a perovskite crystal structure.

6. A method of fabricating a dielectric memory, comprising the steps of:

forming a gate insulating film on a channel region;

forming a first lower electrode layer on said gate insulating film;

forming an interlayer insulating film so as to cover said first lower electrode layer and said gate insulating film;

forming a contact hole in said interlayer insulating film;

forming a second lower electrode layer electrically connected to said first lower electrode layer in said contact hole of said interlayer insulating film;

forming a dielectric film on said interlayer insulating film so as to be brought into contact with the upper surface of said second lower electrode layer;

forming an upper electrode layer on said dielectric film; and patterning said upper electrode layer and said dielectric film.

7. The method according to claim 6, wherein the step of forming said second lower electrode layer comprises the steps of forming a connecting layer up to a predetermined depth of said contact hole, and forming an electrode layer on said connecting layer in said contact hole.

8. The method according to claim 7, further comprising the steps of:

forming a diffusion barrier layer on said connecting layer.

9. The method according to claim 6, further comprising:

forming a buffer layer on said interlayer insulating film.

10. The method according to claim 6, wherein said dielectric film is a ferroelectric film.

11. The method according to claim 10, wherein said ferroelectric film has a perovskite crystal structure.

* * * * *